United States Patent [19]
Shieh et al.

[11] Patent Number: 5,482,891
[45] Date of Patent: Jan. 9, 1996

[54] VCSEL WITH AN INTERGRATED HEAT SINK AND METHOD OF MAKING

[75] Inventors: Chan-Long Shieh, Paradise Valley; John Lungo, Mesa; Michael S. Lebby, Apache Junction, all of Ariz.

[73] Assignee: Motorola, Schaumburg, Ill.

[21] Appl. No.: 407,062

[22] Filed: Mar. 17, 1995

[51] Int. Cl.⁶ .................................................. H01L 21/20
[52] U.S. Cl. ..................... 437/129; 437/209; 437/211; 148/DIG. 95
[58] Field of Search ...................... 437/209, 211, 437/214, 220, 129; 148/DIG. 95; 372/43, 44, 45, 46, 47, 48, 49, 50

[56] References Cited

U.S. PATENT DOCUMENTS

| | | | |
|---|---|---|---|
| 5,216,686 | 6/1993 | Holm et al. | 372/50 |
| 5,256,596 | 10/1993 | Ackley et al. | 437/129 |
| 5,258,316 | 11/1993 | Ackley et al. | 437/129 |
| 5,283,447 | 2/1994 | Olbright et al. | 372/48 |
| 5,293,392 | 3/1994 | Shieh et al. | 437/129 |
| 5,314,838 | 5/1994 | Cho et al. | 437/129 |
| 5,317,587 | 5/1994 | Ackley et al. | 437/129 |
| 5,351,256 | 9/1994 | Schneider et al. | 372/45 |
| 5,351,257 | 9/1994 | Lebby et al. | 372/45 |
| 5,359,618 | 10/1994 | Lebby et al. | 437/129 |

*Primary Examiner*—Kevin M. Picardat
*Attorney, Agent, or Firm*—Gary F. Witting; Eugene A. Parsons

[57] ABSTRACT

A substrate (102) having a surface (103) with a first stack of distributed Bragg reflectors (106), a first cladding region (107), an active region (108), a second cladding region (109), a second stack of distributed Bragg reflectors (110), and a contact region (111) is provided. A mesa (131) with a surface (133) and a trench (136) is formed. A first dielectric layer (122) is formed overlying substrate (102) and covering a portion of trench (136). A seed layer (126) having a pattern is formed, with the pattern of seed layer (126) having an opening on a portion of mesa (131). A metal is selectively plated on seed layer (126), thereby generating a layer (304) on seed layer (126) for removal of heat of VCSEL (101).

16 Claims, 1 Drawing Sheet

VCSEL WITH AN INTERGRATED HEAT SINK AND METHOD OF MAKING

FIELD OF THE INVENTION

This invention relates, in general, to optical devices and, more particularly, to semiconductor lasers.

BACKGROUND OF THE INVENTION

At present, conventional edge emitting semiconductor lasers are playing a more significant role in optical communication due to their high operating efficiency and modulation capabilities; however, conventional edge emitting semiconductor lasers have several short comings or problems, such as a large size, a high cost, as well as manufacturing difficulties, thus making conventional edge emitting lasers unsuitable for high volume manufacturing.

Recently, however, there is an increased interest in a new type of laser called a vertical cavity surface emitting laser (VCSEL). The conventional VCSEL has a potential of several advantages, such as emitting light perpendicular to its die, providing a feasibility of array formation, integration with standard electronic components, as well as on-wafer testing. But, these potential advantages are not capable of being realized because the VCSEL has several problems, such as heat removal and fabrication complexity. Moreover, it should be understood that because of inadequate heat removal many other problems arise, such as reliability, die failure, and the like.

It can readily be seen that conventional edge emitting semiconductor lasers, as well as conventional VCSELs have several disadvantages and problems, thus not enabling their use in high volume manufacturing applications. Therefore, a VCSEL and method for making that removes heat from same, simplifies the fabrication process, reduces cost, with improved reliability would be highly desirable.

DETAILED DESCRIPTION OF THE DRAWINGS

Figure 1:
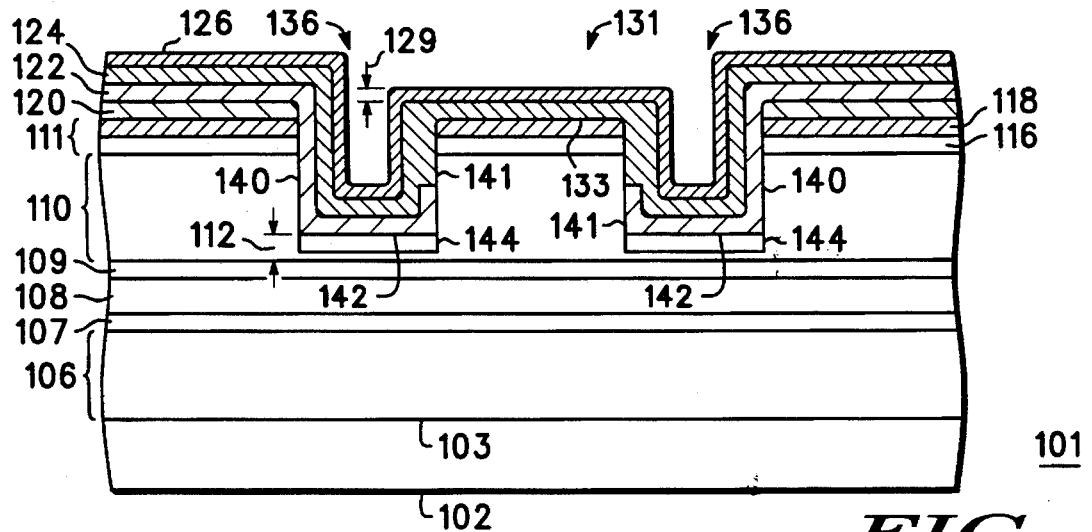
FIG. 1 illustrates a partially fabricated greatly enlarged simplified sectional view of a vertical cavity surface emitting laser.

FIG. 1 illustrates a partially fabricated greatly enlarged simplified sectional view of a vertical cavity surface emitting laser (VCSEL) 101. VCSEL 101 is fabricated to include several features or elements, such as a substrate 102 having a surface 103, a stack of distributed Bragg reflectors (DBRs) 106, a cladding region 107, an active region 108, a cladding region 109, a stack of DBRs 110, a contact region 111 including layers 116 and 118, a layer 120, a layer 122, a conductive layer 124, a layer or a seed layer 126, a dielectric area 128, mesa or ridge 131 having a surface 133, a trench 136 having surfaces 140, 141, 142, and a region 144. It should be understood that FIG. 1 only shows a sectional view of a portion of substrate 102, thereby enabling FIG. 1 to continue into and out of the drawing, as well as being able to extend laterally across the drawing. Thus, VCSEL 101 can represent one of a plurality of VCSELs that make an array.

The present patent application is related to a copending patent application bearing Attorney Docket number CR94-107 entitled METHOD FOR MAKING A VCSEL, filed on Nov. 29, 1994, having Ser. No. 08/346,558 and assigned to the same assignee which is hereby incorporated by reference herein.

As shown in FIG. 1, VCSEL 101 is illustrated as being partially fabricated. For the purpose of orienting the reader, a brief description of materials and methods is provided. Briefly, VCSEL 101 is fabricated on any suitable substrate 102, such as silicon, gallium arsenide, indium gallium phosphide, or the like having surface 103. Surface 103 of substrate 102 is processed to form several epitaxial layers including the stack of DBRs 106, cladding region 107, active region 108, cladding region 109, the stack of DBRs 110. Contact region 111 is made to include layers 116 and 118, wherein layer 116 is an epitaxially deposited material, such as gallium arsenide that is p-doped, e.g., doped with zinc, and wherein layer 118 is a ohmic metal material, such as a metal, e.g., titanium, tungsten, or the like, or an alloy, such as titanium/tungsten.

Mesa 131 and trench 136 are formed by any suitable process or combination of processes, such as deposition, photolithography, etching, or the like. Generally, layer 120 is deposited on contact region 111. Layer 120 is made of any suitable material, such as nitride, oxynitride, silicon dioxide, or the like. A mask layer is then applied to layer 120. The mask layer is made of any suitable photoactive material, such as photoresist, polyimide, or the like. The mask layer is then patterned with a ring formation, thereby exposing portions of layer 120 and covering other portions of layer 120. The exposed portions of layer 120 are then etched or removed by any suitable method, such as a dry etch method, a wet etch method, or the like. Once the exposed portions of layer 120 are removed, portions of contact region 111 subsequently are exposed and etched, thereby removing or etching the exposed portions of contact region 111. Etching is continued until a desired depth is obtained, thereby transferring the ring pattern through contact region 111 and at least into DBRs 110 to make mesa or ridge 131 and trench 136.

Patterning of the mask layer is achieved by any suitable method well known in the art, such as photolithography. Additionally, it should be understood that as the etching of trench 136 continues, a continuous surface, indicated as surfaces 140, 141, and 142 is formed. However, it should be understood that variation of process parameters and equipment can produce trench 136 in a variety of geometric configurations, such a squared channel, a U-groove, a V-groove, or the like. While etching of trench 136 can be continued through the stack of DBRs 106 to surface 103 of substrate 102, in a preferred embodiment of the present invention, etching of trench 136 is continued until a distance 112 is reached in DBRs 110. Distance 112 is defined from cladding region 109 to surface 142 of trench 136. Typically, distance 112 can be any suitable distance; however, in a preferred embodiment of the present invention, distance 112 is less than 1.0 micron, with a nominal distance of less than 0.1 micron.

For example, with layer 120 being made of nitride, with layer 118 being made of titanium/tungsten, and with layer 116 being made of gallium arsenide, layers 120 and 118 are etched in a fluorine based plasma chemistry and layer 116 is etched with a chlorine based chemistry.

Region 144 illustrates a current confinement region that is optionally formed in the stack of DBRs 110 for specific applications of VCSEL 101. Generally, region 144 is formed by any suitable method, such as ion implantation of any suitable ion, such as hydrogen, oxygen, or the like that disrupts epitaxial stacking of atoms in region 144, thereby inhibiting lateral spreading of current, thereby improving performance of VCSEL 101.

Once mesa 131 and trench 136 are properly formed, a layer 122 of any suitable dielectric material, such as silicon dioxide, nitride, oxynitride, or the like is deposited on layer 120, trench 136, and mesa 131. A masking layer similar to that previously described is then applied to layer 122 and patterned, thereby exposing a portion of layer 122 above surface 133 of mesa 131. Generally, patterning of the masking layer is achieved so that the portion of layer 122 above surface 133 of mesa 131 is fully exposed, while trench 136 and other portions of layer 122 are covered and protected by the masking layer. Layer 122 and any remaining material of layer 120 is then etched away or removed by any suitable method which has been described hereinabove. Thus, removing portions of layer 122 and 120 exposed on mesa 131 and exposing surface 133 of mesa 131.

After etching layers 120 and 122 has been completed, conductive layer 124 is deposited or disposed on substrate 102 by any suitable method, such as evaporation, sputtering, or the like. Conductive layer 124 is made of any suitable conductive material, such as a metal, e.g., aluminum, copper, titanium, tungsten, or the like, an alloy, e.g., aluminum/copper, titanium/tungsten, or the like.

After the deposition of conductive layer 124, layer or seed layer 126 is formed on conductive layer 124 by any suitable method, such as sputtering, evaporating, or the like. Generally, layer 126 can be made of any suitable material, such as a metal, e.g., nickel, gold, titanium, tungsten, or the like, an alloy, e.g., titanium/tungsten, or the like, thereby enabling selective plating onto these materials. However, in a preferred embodiment of the present invention, a gold material that is sputtered on conductive layer 124 is used.

Figure 2:
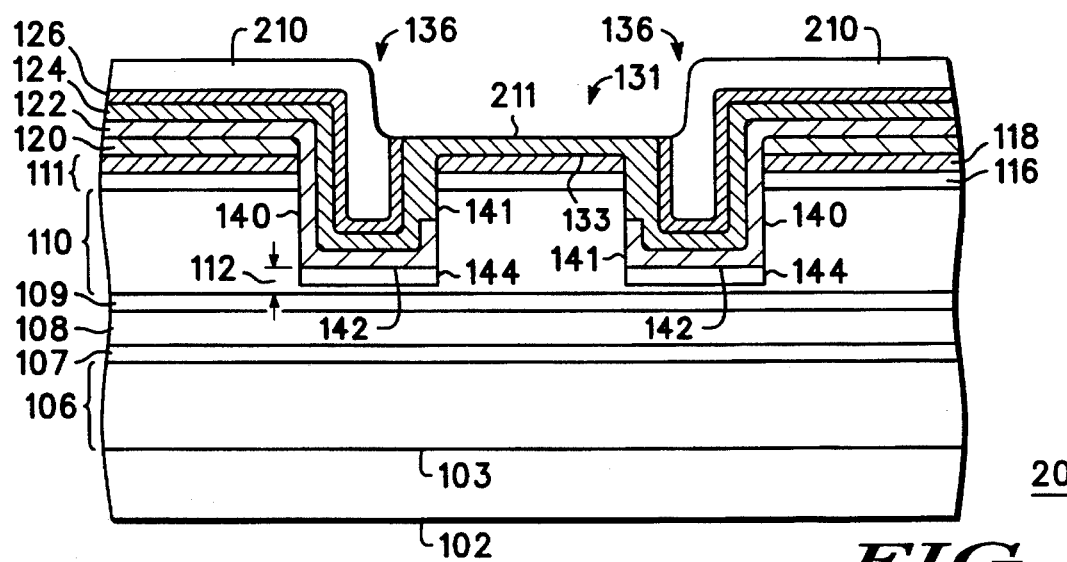
FIG. 2 illustrates the vertical cavity surface emitting laser shown in FIG. 1, in which the vertical cavity surface emitting laser has under gone further processing.

FIG. 2 illustrates a partially fabricated greatly enlarged simplified sectional view of a vertical cavity surface emitting laser 201 having undergone additionally processing. It should be understood that similar features or elements previously identified in FIG. 1 will retain their original identifying numerals.

Once layer 126 is properly formed, a masking layer 210 is applied to layer 126 and subsequently patterned in a similar fashion a previously described, thereby exposing a portion of layer 126 above surface 133 of mesa 131. Generally, patterning of masking layer 210 is achieved so that the portion of layer 126 above surface 133 of mesa 131 is fully exposed, while trench 136 and other portions of layer 126 are covered and protected by masking layer 210.

The portion of layer 126 is then etched away or removed by any suitable method, such as a dry etch method, a wet etch method, or a combination of both which has been described hereinabove. Removal of the portion of layer 126 results in exposure of a portion 211 of conductive layer 124 on mesa 131.

After portion 211 of conductive layer 124 has been exposed, VCSEL 201 is ready for further processing.

Figure 3:
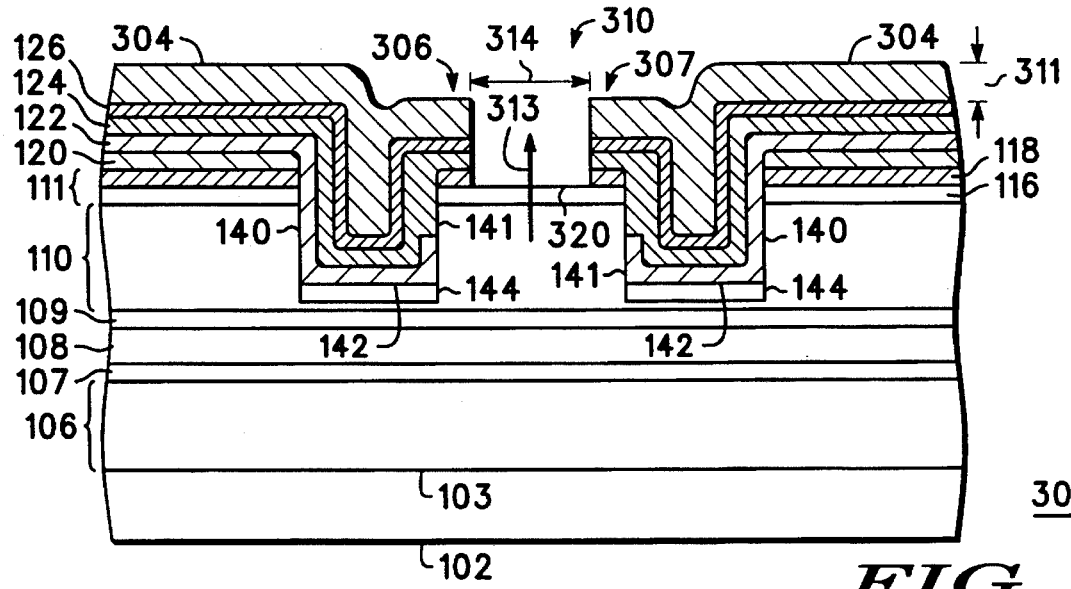
FIG. 3 illustrates the vertical cavity surface emitting laser shown in FIG. 2, in which the vertical cavity surface emitting laser has under gone further processing.

FIG. 3 illustrates a greatly enlarged simplified sectional view of vertical cavity surface emitting laser 301, shown in FIG. 1, having under gone further processing. It should be understood that similar features or elements previously identified in FIG. 1 will retain their original identifying numerals. It should be further understood that FIG. 2 only shows a sectional view of a portion of substrate 102, thereby enabling FIG. 2 to continue into and out of the drawing, as well as being able to extend laterally across the drawing, thus enabling VCSEL 301 represent one of an array of VCSELs.

Once layer 126 has been formed, substrate 102 is subjected to a selective deposition process, such as an electroplating or an electrodeposition process, an electroless deposition process, or the like. Generally, the electroplating process is performed in an electroplating system that can include a reservoir, a pumping mechanism, a baffle, a fountain cup, an anode, and a cathode. Generally, an electroplating solution is pumped from the reservoir, passed the anode, through the baffle, into the fountain cup, and passed the cathode. Flow rates of the electroplating solution can range from 0 to 27 liters per minute, with temperatures ranging from 20.0 to 60.0 degrees Celsius. It should be understood that a flow rate of 0 liters per second means that the electroplating solution is contained in the fountain cup.

Any suitable bias source such as a DC Bias or the like can be applied across the anode and cathode; however, in a preferred embodiment of the present invention, the bias has a current density ranging from approximately 1 milliampere per square centimeter to 12 milliamperes per square centimeter. Additionally, the current can be a pulsed current train having a frequency ranging from 10 to 4,000 Hertz with a duty cycle of at least 10 percent. The pulsed current train can be modulated so that the pulse is on for a time ranging between approximately one millisecond and three seconds. Additionally, it should be understood that any suitable bias can be used, such as a DC Bias or the like.

Generally, any suitable plating solution having a platable metal, such as gold, nickel, copper, or the like can be used; however, in a preferred embodiment of the present invention the plating solution is an electroplating solution that includes a mixture of sulfite based gold which may also include a brightener. In a preferred embodiment of the present invention, the electroplating solution is a sulfite based plating solution sold under the trademark "SELREX" or "NEUTRONEX" 309 produced by Entone-OMI Inc., wherein "SELREX" and "NEUTRONEX" 309 includes a "NEUTRONEX" make-up solution, a "NEUTRONEX" 309 Replentisher solution, and a "NERTRONEX" 309 Conducting salts solution. Adjustments in pH of the electroplating solution can be any suitable acid or base, such as sodium hydride or sulfuric acid. In a preferred embodiment of the electroplating solution, gold concentration ranges from 10.272 to 12.326 grams per litter of electroplating solution, with thallium as the brightener. Thallium concentration can range from 20 to 100 milligrams per litter, with a nominal concentration of 75 milligrams per liter. It should be understood that while specific concentrations are provided hereinabove these specific concentrations vary with specific types of electroplating systems.

Once the selective plating process is completed, layer 304 is formed on layer 126, thereby fabricating an integrated heat sink on VCSEL 301. Generally, thickness 311 of layer 304 can be any suitable thickness ranging range from 500 Angstroms to 10 microns, with a preferred range from 2 to 8 microns, with a nominal range from 3 to 7 microns. It should be understood that as thickness 311 increases heat conducting efficiency of layer 304 increases. Additionally, in a preferred embodiment of the present invention, the plating process is continued until portions 306 and 307 are formed. It should be understood that, typically, VCSEL 301 has a circular shape, thus portions 306 and 307 can be physically connected. Portions 306 and 307 encroach upon each other on dielectric area 128, thereby forming orifice or emission hole 310. By generating portions 306 and 307, a method for controlling a diameter 314 of apeture or emission hole 310 is provided, thus enabling a smaller spot size to be emitted from VCSEL 301.

By selectively forming layer 304 on layer 126, layer 304 provides a self-aligned heat conductive layer that carries heat away from VCSEL 301 during operation, as well as providing an electrical contact for VCSEL 301. Further, by removing heat away from VCSEL 301 during operation, VCSEL 301 has improved reliability and performance. First, since heat is dissipated more evenly and quickly, stress caused by differing coefficients of expansion is reduced, thereby improving life-time reliability, cracking of substrate 102, and a more uniform output of light from VCSEL 301. Additionally, since layer 304 is fabricated by self-aligned process, additional processing steps are obviated, thereby significantly simplifying fabrication of VCSEL 301.

Once formation of layer 304 is completed, VCSEL 301 is etched by any suitable method to expose surface 320, thereby allowing light 313 to be emitted from VCSEL 301.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

By now it should be appreciated that a novel article and method for making have been provided. VCSEL has an improved heat removal, thereby providing improved device stability, improved life-time reliability, and improved manufactureability. Additionally, since the heat conducting material is selectively plated on VCSEL, the heat conducting material is disposed on VCSEL with a minimum of process steps, as well as having the heat conducting material being disposed on VCSEL in a self-aligned manner, thereby further improving manufactureability.

What is claimed is:

1. A method for making a VCSEL with an integrated heat sink comprising the steps of:

providing a substrate having a surface with a first stack of distributed Bragg reflectors, a first cladding region, an active region, a second cladding region, a second stack of distributed Bragg reflectors, and a contact region;

forming a mesa with a surface and a trench, wherein said trench extends from said contact region into a portion of said second stack of distributed Bragg reflectors, and wherein said trench is adjacent to a portion of said mesa;

forming a first dielectric layer overlying said substrate and covering a portion of said trench with a portion of said contact region being exposed;

forming a conductive layer overlying said substrate;

forming a seed layer having a pattern, said pattern of said seed layer having an opening on said mesa exposing a portion of said conductive layer; and plating a metal selectively on said seed layer generating a layer on said seed layer for removal of heat, thereby generating an integrated heat sink.

2. A method for making a VCSEL with an integrated heat sink as claimed in claim 1 where, in the step of providing a substrate having a surface with a first stack of distributed Bragg reflectors, a first cladding region, an active region, a second cladding region, a second stack of distributed Bragg reflectors, and a contact region disposed thereon, the contact region is provided by including depositing a titanium/tungsten layer.

3. A method for making a VCSEL with an integrated heat sink as claimed in claim 1 where, in the step of forming a mesa with a surface and a trench, said mesa with said surface and said trench are formed by a dry etch process.

4. A method for making a VCSEL with an integrated heat sink as claimed in claim 1 where, in the step of forming a seed layer, the seed layer is formed by a deposition process.

5. A method for making a VCSEL with an integrated heat sink as claimed in claim 1 where, prior to the step of forming a first dielectric layer overlying said substrate and cover a portion of said trench, the step of forming a current confinement region in said trench is performed.

6. A method for making a VCSEL with an integrated heat sink as claimed in claim 5 where, in the step of forming a current confinement region, the current confinement region is fabricated by changing structural integrity of a portion of the second stack of the distributed Bragg reflectors.

7. A method for making a VCSEL with an integrated heat sink as claimed in claim 5 where, in the step of forming a current confinement region, the current confinement region is fabricated by ion implantation.

8. A method for making a VCSEL having a heat sink comprising the steps of:

providing a substrate having a surface with a first stack of distributed Bragg reflectors, a first cladding region, an active region, a second cladding region, a second stack of distributed Bragg reflectors, and a contact region having a ohmic metal layer disposed thereon;

forming a masking layer with a pattern on the ohmic metal layer, wherein the pattern exposes portions of the ohmic metal layer while covering other portions of the ohmic metal layer;

transferring the pattern into the ohmic metal layer and into the second stack of distributed Bragg reflectors to form a mesa having a surface;

forming a dielectric layer on the substrate covering the surface of the mesa and the masking layer;

forming a layer on the dielectric layer, the layer exposing the dielectric layer on the mesa;

etching the dielectric layer exposed on the mesa, thereby removing the dielectric layer on the mesa and exposing the ohmic metal layer on the mesa;

forming a second dielectric layer on the surface of the mesa;

forming a metal layer on the dielectric layer and on the second dielectric layer;

forming a seed layer having a pattern, the pattern of the seed layer forming an opening on a portion of the second dielectric layer; and plating a second metal selectively on the seed layer, thereby generating a VCSEL.

9. A method for making a VCSEL having a heat sink as claimed in claim 8 where, in the step of providing a substrate having a surface with a first stack of distributed Bragg reflectors, a first cladding region, an active region, a second cladding region, a second stack of distributed Bragg reflectors, and a contact region having a ohmic metal layer disposed thereon, the ohmic metal layer is provided by depositing a titanium/tungsten layer.

10. A method for making a VCSEL having a heat sink as claimed in claim 8 where, in the step of forming a masking layer with a pattern on the ohmic metal layer, the masking layer is formed by depositing a layer of nitride.

11. A method for making a VCSEL having a heat sink as claimed in claim 8 where, in the step of transferring the pattern into the ohmic metal layer and into the second stack of distributed Bragg reflectors to form a mesa having a surface, the transferring of the pattern into the ohmic metal layer and into the second stack of distributed Bragg reflectors is achieved by plasma etching.

12. A method for making a VCSEL having a heat sink as claimed in claim 8 where, in prior to the step of forming a dielectric layer on the substrate covering the surface of the mesa and the masking layer, the step of forming a current confinement region is fabricated.

13. A method for making a VCSEL having a heat sink as claimed in claim 12 where, in the step of forming a current confinement region, the current confinement region is fabricated by changing structural integrity of a portion of the second stack of the distributed Bragg reflectors.

14. A method for making a VCSEL having a heat sink as claimed in claim 12 where, in the step of forming a current confinement region, the current confinement region is fabricated by ion implantation.

15. A method for making a VCSEL having auto-aligned heat sink comprising the steps of:

provide a substrate having a surface with a first stack of distributed Bragg reflectors, a first cladding region, an active region, a second cladding region, a second stack of distributed Bragg reflectors, and a contact region having a ohmic metal layer disposed thereon;

forming a masking layer having a pattern on the ohmic metal layer, the pattern of the masking layer exposes portions of the ohmic metal layer, while covering other portions of the ohmic metal layer;

etching the exposed portions of the ohmic metal layer to expose portions of the contact region;

etching the exposed portions of the contact region into a portion of the second stack of distributed Bragg reflectors to form a mesa, thereby exposing a portion of the second stack of distributed Bragg reflectors;

forming a dielectric layer overlying portions of contact layer and covering a portion of the trench;

forming a metal layer on the dielectric layer, the trench and the mesa;

forming seed layer having a pattern, the pattern of the seed layer forming an opening on a portion of the metal layer; and plating a second metal selectively on the seed layer, thereby an auto-aligned heat sink.

16. A method for controlling an aperture of a light emitting device comprising the steps of:

providing a substrate having a surface with a first stack of distributed Bragg reflectors, a first cladding region, an active region, a second cladding region, a second stack of distributed Bragg reflectors, and a contact region;

forming a mesa with a surface and a trench, wherein said trench extends from said contact region into a portion of said second stack of distributed Bragg reflectors, and wherein said trench is adjacent to a portion of said mesa;

forming a first dielectric layer overlying said substrate and covering a portion of said trench with a portion of said contact region being exposed;

forming a conductive layer overlying said substrate;

forming a seed layer having a pattern, said pattern of said seed layer having an opening on said mesa exposing a portion of said conductive layer; and plating a metal selectively on said seed layer generating a metal layer on said seed layer, said metal of said metal layer encroaches on said surface of said mesa to form an orifice, thereby sizing said orifice of said light emitting device.

* * * * *